United States Patent
Ouyang et al.

(10) Patent No.: US 9,685,187 B1
(45) Date of Patent: Jun. 20, 2017

(54) BONDING TOOL AND METHOD FOR HIGH ACCURACY CHIP-TO-CHIP BONDING

(71) Applicant: Western Digital (Fremont), LLC, Fremont, CA (US)

(72) Inventors: Bin Ouyang, Klong Luang (TH); Chee Kheng Lim, Pakkret (TH)

(73) Assignee: WESTERN DIGITAL (FREMONT), LLC, Fremont, CA (US)

( * ) Notice: Subject to any disclaimer, the term of this patent is extended or adjusted under 35 U.S.C. 154(b) by 0 days.

(21) Appl. No.: 14/498,664

(22) Filed: Sep. 26, 2014

(51) Int. Cl.
| | |
|---|---|
| *B25J 15/06* | (2006.01) |
| *H01L 23/48* | (2006.01) |
| *H01L 23/52* | (2006.01) |
| *H01L 29/40* | (2006.01) |
| *G11B 5/84* | (2006.01) |
| *B32B 37/14* | (2006.01) |
| *B32B 38/00* | (2006.01) |
| *B32B 38/10* | (2006.01) |

(52) U.S. Cl.
CPC ............... *G11B 5/84* (2013.01); *B32B 37/14* (2013.01); *B32B 38/0008* (2013.01); *B32B 38/0012* (2013.01); *B32B 38/10* (2013.01); *B32B 2038/002* (2013.01); *B32B 2038/0016* (2013.01); *B32B 2307/208* (2013.01); *B32B 2310/0418* (2013.01); *B32B 2310/0463* (2013.01); *B32B 2310/14* (2013.01)

(58) Field of Classification Search
CPC ..... H01L 21/68707; H01L 2224/75743; H01L 2224/78743
USPC .......................................................... 294/185
See application file for complete search history.

(56) References Cited

U.S. PATENT DOCUMENTS

| | | | | |
|---|---|---|---|---|
| 5,986,335 | A | * | 11/1999 | Amagai ............... H01L 23/4951 257/666 |
| 6,075,673 | A | | 6/2000 | Wilde et al. |
| 6,097,575 | A | | 8/2000 | Trang et al. |
| 6,125,014 | A | | 9/2000 | Riedlin, Jr. |
| 6,125,015 | A | | 9/2000 | Carlson et al. |
| 6,130,863 | A | | 10/2000 | Wang et al. |
| 6,137,656 | A | | 10/2000 | Levi et al. |
| 6,144,528 | A | | 11/2000 | Anaya-Dufresne et al. |
| 6,147,838 | A | | 11/2000 | Chang et al. |
| 6,151,196 | A | | 11/2000 | Carlson et al. |
| 6,178,064 | B1 | | 1/2001 | Chang et al. |
| 6,181,522 | B1 | | 1/2001 | Carlson |
| 6,181,673 | B1 | | 1/2001 | Wilde et al. |
| 6,229,672 | B1 | | 5/2001 | Lee et al. |
| 6,236,543 | B1 | | 5/2001 | Han et al. |
| 6,246,547 | B1 | | 6/2001 | Bozorgi et al. |
| 6,249,404 | B1 | | 6/2001 | Doundakov et al. |
| 6,330,131 | B1 | | 12/2001 | Nepela et al. |
| 6,339,518 | B1 | | 1/2002 | Chang et al. |

(Continued)

*Primary Examiner* — Thomas Pham
(74) *Attorney, Agent, or Firm* — Foley & Lardner LLP

(57) ABSTRACT

A chip-to-chip eutectic bonding system includes a stage with a top surface, a bottom surface, and a plurality of vacuum apertures extending therebetween and a carrier with a top surface, the top surface including one or more smooth surface portions and one or more rough surface portions, wherein at least one smooth carrier surface portion laterally aligns to at least one vacuum aperture, and at least one of the stage's rough surface portions frictionally couples to at least one of the carrier's rough surface portions when the carrier top surface couples to and opposes the stage bottom surface.

6 Claims, 6 Drawing Sheets

(56) References Cited

U.S. PATENT DOCUMENTS

| | | |
|---|---|---|
| 6,349,017 B1 | 2/2002 | Schott |
| 6,373,660 B1 | 4/2002 | Lam et al. |
| 6,378,195 B1 | 4/2002 | Carlson |
| 6,506,672 B1 * | 1/2003 | Dagenais .............. H01L 21/288 257/E21.174 |
| 6,522,504 B1 | 2/2003 | Casey |
| 6,538,850 B1 | 3/2003 | Hadian et al. |
| 6,583,953 B1 | 6/2003 | Han et al. |
| 6,646,832 B2 | 11/2003 | Anaya-Dufresne et al. |
| 6,661,612 B1 | 12/2003 | Peng |
| 6,665,146 B2 | 12/2003 | Hawwa et al. |
| 6,690,545 B1 | 2/2004 | Chang et al. |
| 6,704,173 B1 | 3/2004 | Lam et al. |
| 6,708,389 B1 | 3/2004 | Carlson et al. |
| 6,717,773 B2 | 4/2004 | Hawwa et al. |
| 6,721,142 B1 | 4/2004 | Meyer et al. |
| 6,744,599 B1 | 6/2004 | Peng et al. |
| 6,771,468 B1 | 8/2004 | Levi et al. |
| 6,796,018 B1 | 9/2004 | Thornton |
| 6,801,402 B1 | 10/2004 | Subrahmanyam et al. |
| 6,856,489 B2 | 2/2005 | Hawwa et al. |
| 6,873,496 B1 | 3/2005 | Sun et al. |
| 6,912,103 B1 | 6/2005 | Peng et al. |
| 6,937,439 B1 | 8/2005 | Chang et al. |
| 6,956,718 B1 | 10/2005 | Kulkarni et al. |
| 6,972,930 B1 | 12/2005 | Tang et al. |
| 7,006,330 B1 | 2/2006 | Subrahmanyam et al. |
| 7,006,331 B1 | 2/2006 | Subrahmanyam et al. |
| 7,010,847 B1 | 3/2006 | Hadian et al. |
| 7,019,945 B1 | 3/2006 | Peng et al. |
| 7,027,264 B1 | 4/2006 | Subrahmanyam et al. |
| 7,042,070 B2 | 5/2006 | Yew et al. |
| 7,085,104 B1 | 8/2006 | Hadian et al. |
| 7,099,117 B1 | 8/2006 | Subrahmanyam et al. |
| 7,174,622 B2 | 2/2007 | Meyer et al. |
| 7,289,299 B1 | 10/2007 | Sun et al. |
| 7,307,816 B1 | 12/2007 | Thornton et al. |
| 7,315,435 B1 | 1/2008 | Pan |
| 7,315,436 B1 | 1/2008 | Sanchez |
| 7,414,814 B1 | 8/2008 | Pan |
| 7,436,631 B1 | 10/2008 | Fanslau, Jr. et al. |
| 7,474,508 B1 | 1/2009 | Li et al. |
| 7,477,486 B1 | 1/2009 | Sun et al. |
| 7,593,190 B1 | 9/2009 | Thornton et al. |
| 7,595,963 B1 | 9/2009 | Chen et al. |
| 7,616,405 B2 | 11/2009 | Hu et al. |
| 7,729,089 B1 | 6/2010 | Hogan |
| 7,995,310 B1 | 8/2011 | Pan |
| 8,081,400 B1 | 12/2011 | Hu |
| 8,087,973 B1 | 1/2012 | Sladek et al. |
| 8,089,730 B1 | 1/2012 | Pan et al. |
| 8,164,858 B1 | 4/2012 | Moravec et al. |
| 8,199,437 B1 | 6/2012 | Sun et al. |
| 8,208,224 B1 | 6/2012 | Teo et al. |
| 8,218,268 B1 | 7/2012 | Pan |
| 8,240,545 B1 | 8/2012 | Wang et al. |
| 8,256,272 B1 | 9/2012 | Roajanasiri et al. |
| 8,295,012 B1 | 10/2012 | Tian et al. |
| 8,295,013 B1 | 10/2012 | Pan et al. |
| 8,295,014 B1 | 10/2012 | Teo et al. |
| 8,320,084 B1 | 11/2012 | Shum et al. |
| 8,325,446 B1 | 12/2012 | Liu et al. |
| 8,325,447 B1 | 12/2012 | Pan |
| 8,339,742 B1 | 12/2012 | Sladek et al. |
| 8,339,747 B1 | 12/2012 | Hales et al. |
| 8,339,748 B2 | 12/2012 | Shum et al. |
| 8,343,363 B1 | 1/2013 | Pakpum et al. |
| 8,345,519 B1 | 1/2013 | Pan |
| 8,418,353 B1 | 4/2013 | Moravec et al. |
| 8,441,896 B2 | 5/2013 | Wang et al. |
| 8,446,694 B1 | 5/2013 | Tian et al. |
| 8,456,643 B2 | 6/2013 | Prabhakaran et al. |
| 8,456,776 B1 | 6/2013 | Pan |
| 8,462,462 B1 | 6/2013 | Moravec et al. |
| 8,477,459 B1 | 7/2013 | Pan |
| 8,485,579 B2 | 7/2013 | Roajanasiri et al. |
| 8,488,279 B1 | 7/2013 | Pan et al. |
| 8,488,281 B1 | 7/2013 | Pan |
| 8,490,211 B1 | 7/2013 | Leary |
| 8,514,522 B1 | 8/2013 | Pan et al. |
| 8,533,936 B1 | 9/2013 | Puttichaem et al. |
| 8,545,164 B2 | 10/2013 | Choumwong et al. |
| 8,553,365 B1 | 10/2013 | Shapiro et al. |
| 8,587,901 B1 | 11/2013 | Puttichaem et al. |
| 8,593,764 B1 | 11/2013 | Tian et al. |
| 8,599,653 B1 | 12/2013 | Mallary et al. |
| 8,605,389 B1 | 12/2013 | Pan et al. |
| 8,611,050 B1 | 12/2013 | Moravec et al. |
| 8,611,052 B1 | 12/2013 | Pan et al. |
| 8,623,197 B1 | 1/2014 | Kobsiriphat et al. |
| 8,624,184 B1 | 1/2014 | Souza et al. |
| 8,665,566 B1 | 3/2014 | Pan et al. |
| 8,665,567 B2 | 3/2014 | Shum et al. |
| 8,665,677 B1 | 3/2014 | Panitchakan et al. |
| 8,665,690 B1 | 3/2014 | Moravec et al. |
| 8,693,144 B1 | 4/2014 | Pan et al. |
| 8,756,795 B1 | 6/2014 | Moravec et al. |
| 8,758,083 B1 | 6/2014 | Rudy et al. |
| 8,760,812 B1 | 6/2014 | Chen et al. |
| 8,770,463 B1 | 7/2014 | Puttichaem et al. |
| 8,773,664 B1 | 7/2014 | Wang et al. |
| 8,792,212 B1 | 7/2014 | Pan et al. |
| 8,792,213 B1 | 7/2014 | Vijay et al. |
| 8,797,691 B1 | 8/2014 | Tian et al. |
| 2010/0261312 A1 * | 10/2010 | Maki ................ H01L 21/6836 438/109 |
| 2013/0062782 A1 * | 3/2013 | Yoshimura .............. H01L 24/75 257/777 |
| 2013/0244541 A1 | 9/2013 | Yaemglin et al. |
| 2013/0293982 A1 | 11/2013 | Huber |
| 2013/0299947 A1 * | 11/2013 | Uehling ................ H01L 22/20 257/620 |

* cited by examiner

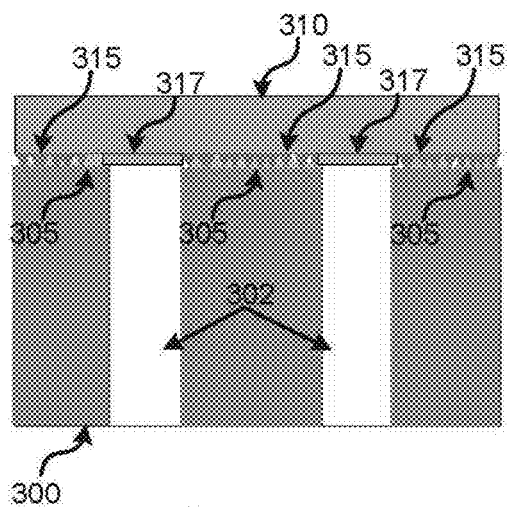 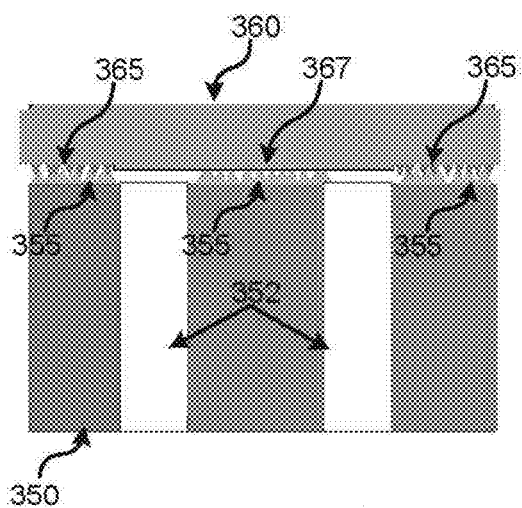
Figure 3A  Figure 3B
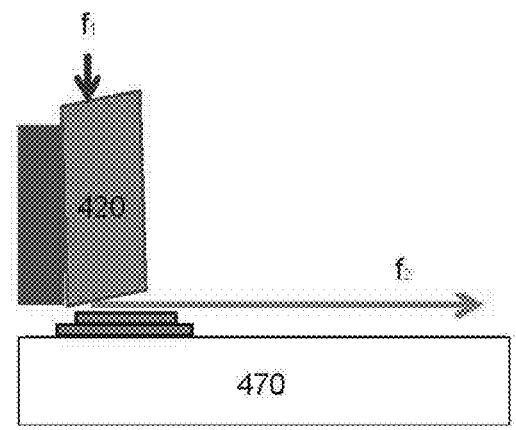 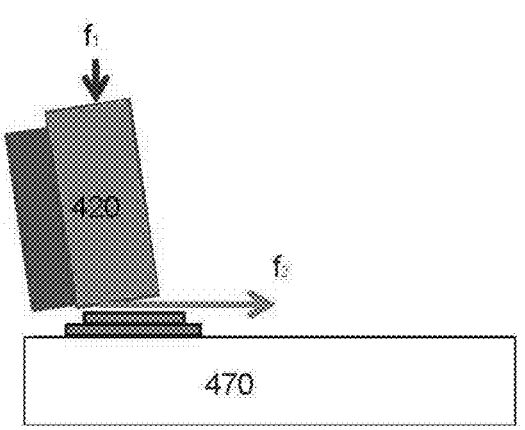
Figure 4A  Figure 4B

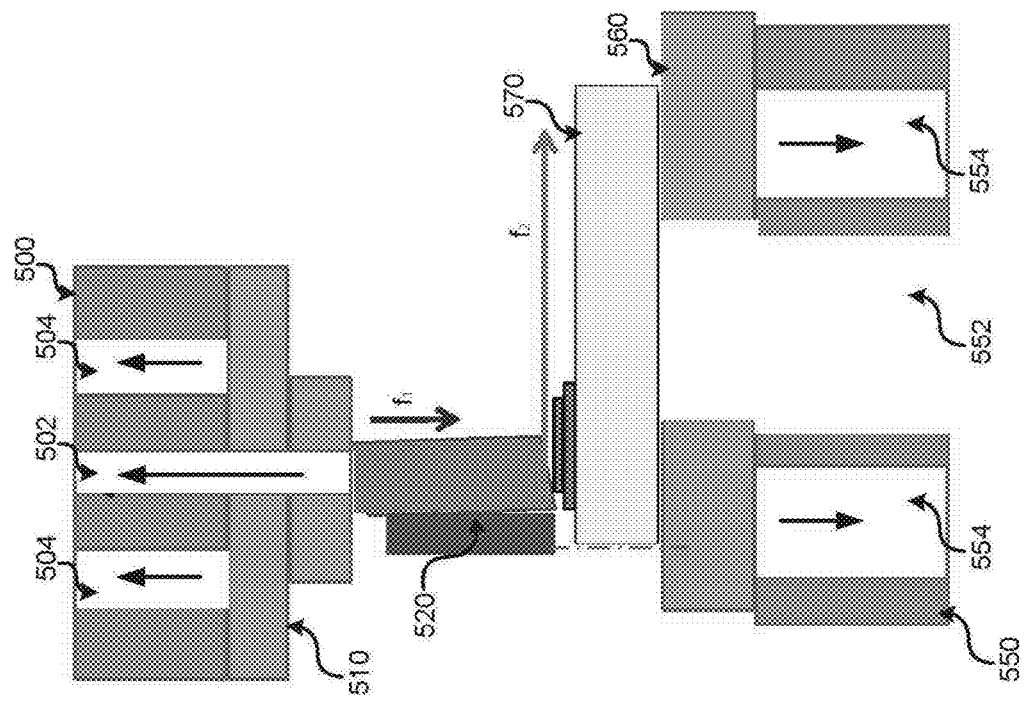
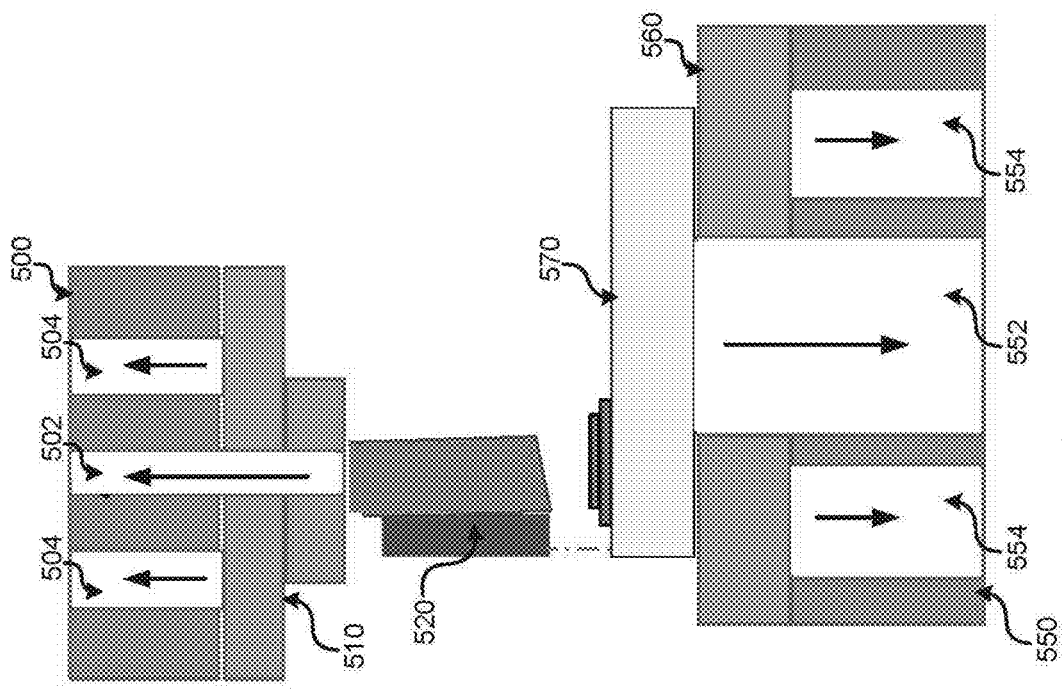

US 9,685,187 B1

BONDING TOOL AND METHOD FOR HIGH ACCURACY CHIP-TO-CHIP BONDING

TECHNICAL FIELD

The present disclosure relates to eutectic bonding technology, and in particular, to chip-to-chip bonding techniques used in the manufacturing of magnetic recording media.

BACKGROUND

For all types of substrates, perpendicular magnetic recording (PMR) technology has become more prevalent in magnetic recording media with the goal of increasing areal density. Areal density is generally limited by the media's ability to, at a sufficiently small bit size, write a data bit, read back the same data bit, and maintain the magnetic characteristics of the data bit over time. For magnetic media, these parameters are controlled by the materials coercivity. However, there exists a threshold wherein the coercivity is so high, and the bit size so small, that the writing element must use an impractically high magnetic field to affect change to a data bit. The advent of heat-assisted magnetic recording (HAMR) media addresses this problem by applying heat to a data bit during a write operation to lower the coercivity to a writable level, and then removing the heat to allow the coercivity to return to a high level to keep the data bit stable.

By using HAMR technology, areal density in hard disk drives can be extended beyond 1 Tb/in2. HAMR media generally incorporate a semiconductor laser diode coupled to a waveguide to provide heat energy to the non-volatile recording media during write operations. During the manufacturing process of the HAMR head, the semiconductor laser diode chip is aligned and bonded on a submount chip, sometimes referred to as the Chip-on-Submount-Assembly (COSA). The COSA is then aligned and mounted on a magnetic head slider assembly, with the light emitting end of the laser diode coupling to a waveguide. In order to efficiently deliver laser energy through, the alignment tolerance for the COSA-to-slider mounting process generally is less than 0.5 um at 3-sigma.

The COSA-to-slider mounting process may include a eutectic bonding step. Eutectic bonding incorporates the use of a eutectic alloy deposited on the surfaces of two objects, and then bringing the surfaces of those two objects in contact while applying heat and pressure. The eutectic alloy will liquefy at predetermined heat and pressure combinations, and then re-solidifies once the heat and/or pressure is removed, thus creating a bond between the two objects. One such eutectic bonding process may be used to bond a COSA to a slider by applying a eutectic alloy to a surface of the COSA and/or to an opposite facing surface of a slider, and then bringing the COSA in contact with the slider while applying heat and pressure. In order to stabilize the COSA and the slider during the bonding process, each of the COSA and the slider may be coupled to a carrier using a vacuum mounting process, and the respective carrier may be coupled to an alignment stage, also using a vacuum mount. Conventional bonding processes, however, may result in lowered yield due to misalignment because of lateral sliding forces that are generated when orthogonal pressure is applied to the COSA and slider during bonding. For example, the smooth surfaces on conventional alignment stages and carriers provide minimal lateral resistance when components start to slide. The resulting potential for misalignment results in a lower than desired yield of properly aligned completed COSA-on-slider assemblies.

BRIEF DESCRIPTION OF THE DRAWINGS

Various embodiments are illustrated by way of example, and not limitation, in the figures of the accompanying drawings in which:

FIG. 3A is a cross-section diagram of a carrier with rough and smooth surfaces coupled to a stage with rough surfaces consistent with embodiments disclosed herein;

FIG. 3B is a cross-section diagram of a carrier with rough and smooth surfaces coupled to a stage with rough surfaces consistent with embodiments disclosed herein;

FIG. 4A is side-view diagram illustrating sliding forces present during a chip-to-chip bonding process;

FIG. 4B is side-view diagram illustrating sliding forces present during a chip-to-chip bonding process;

FIG. 5A is side-view diagram illustrating good chip-to-chip alignment during a chip-to-chip bonding process;

FIG. 5B is side-view diagram illustrating bad chip-to-chip alignment following a chip-to-chip bonding process;

Figure 1:
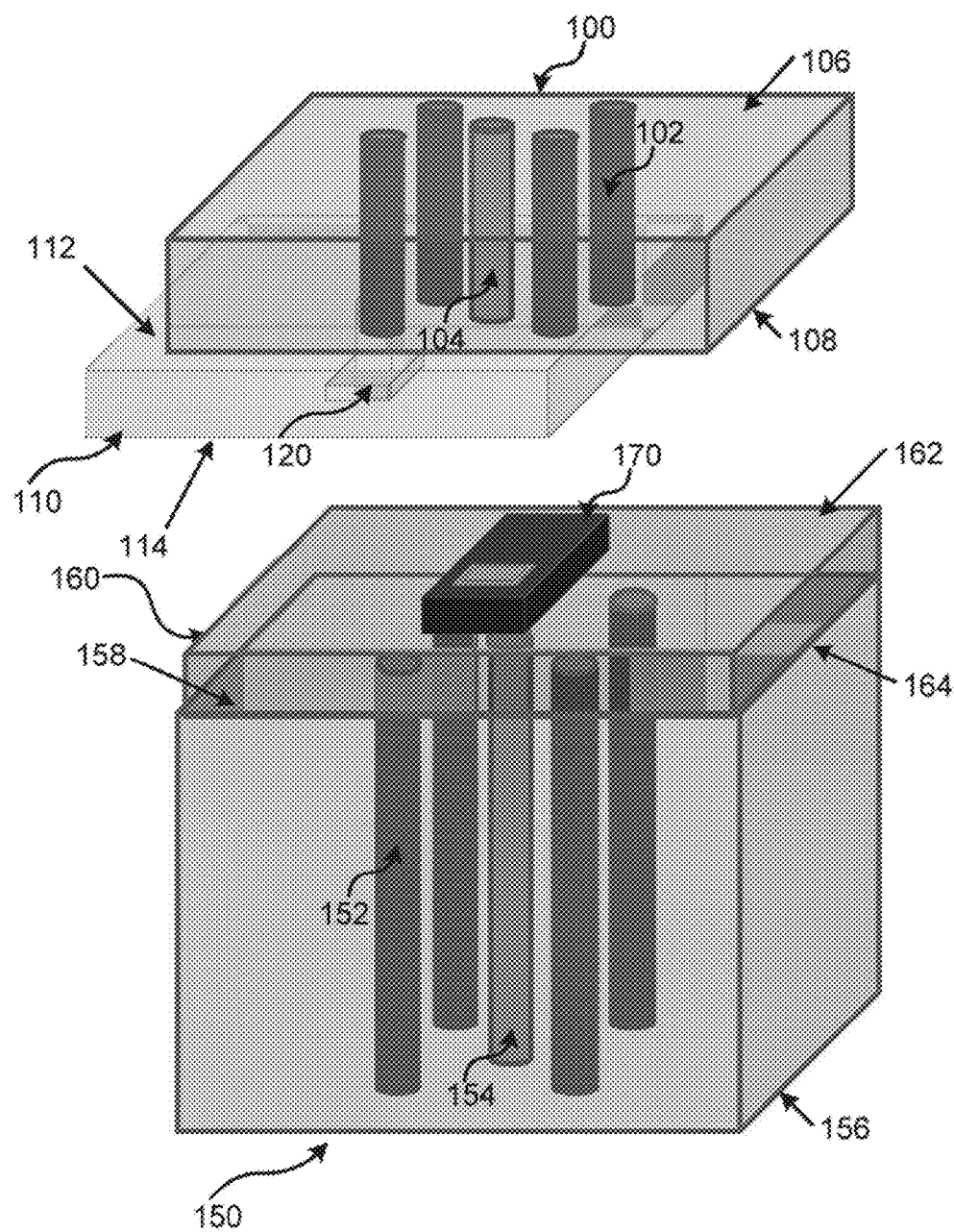
FIG. 1 is a perspective view diagram of a chip-to-chip bonding device consistent with embodiments disclosed herein.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION

In the following description, numerous specific details are set forth to provide a thorough understanding of various embodiment of the present disclosure. It will be apparent to one skilled in the art, however, that these specific details need not be employed to practice various embodiments of the present disclosure. In other instances, well known components or methods have not been described in detail to avoid unnecessarily obscuring various embodiments of the present disclosure.

As disclosed herein, a eutectic bonding tool includes a stage and a carrier, wherein the stage includes at least one vacuum aperture extending between a top surface and a bottom surface, and the bottom surface includes one or more rough surface portions. In some embodiments, the carrier includes a top surface with one or more rough surface portions and one or more smooth surface portions, wherein at least one of the carrier's smooth surface portions laterally aligns to one of the vacuum apertures when the carrier's top surface couples to and opposes the stage's bottom surface.

In some embodiments, the position of the stage and of the carrier are vertically flipped such that the carrier is located above the stage, instead of below the stage, such that the stage or carrier surfaces referred to as being top surfaces may be bottom surfaces, and the stage or carrier surfaces referred to as being bottom surfaces may be top surfaces. In other words, for the purposes of this application, the terms top or bottom may be interchanged when appropriate according to the relative vertical positions of the stage and carrier. For example, the embodiment disclosed above may also be described such that the stage includes a top surface with one or more rough surface portions, and the carrier includes a bottom surface with one or more rough surface portions and one or more smooth surface portions, wherein at least one of the carrier's smooth surface portions laterally aligns to one of the vacuum apertures when the carrier's bottom surface couples to and opposes the stage's top surface.

In some examples, at least one of the stage's rough surface portions frictionally couples to at least one of the carrier's rough surface portions such that frictional force counteracts lateral movement of the carrier relative to the stage. Accordingly, the carrier's position becomes laterally stable with respect to the stage, even when lateral slipping forces are applied during the eutectic bonding process, resulting in improved lateral alignment of the carrier with respect to the stage and increasing product yield.

Some embodiments of the disclosure provide a method for vacuum coupling a carrier to a stage that includes providing a stage with a top surface, a bottom surface, and at least one vacuum aperture extending therebetween, wherein the bottom surface includes one or more rough surface portions. The method may also include providing a carrier that includes a top surface with one or more smooth surface portions and one or more rough surface portions. The method may also include laterally aligning at least one of the carrier's smooth surface portions with at least one of the stage's vacuum apertures and vacuum coupling the carrier to the stage by bringing the carrier's top surface in contact with the stage's bottom surface and removing air pressure from the vacuum apertures.

In some examples, the method also includes heating the stage using a direct heat source, such as a stage heater. In other examples, the method includes heating the stage using an indirect heat source. Providing heat to the stage may enable heating the carrier and any components—such as a COSA or a slider—that are coupled to the carrier. Accordingly, providing heat to the stage, carrier, and any attached component may enable a eutectic bonding process by liquefying any eutectic alloy layered between the components.

In some embodiments, the method also includes laterally aligning at least one of the carrier's rough surface portions with at least one of the stage's rough surface portions. In some examples, the method also includes frictionally coupling at least one of the carrier's rough surface portions to at least one of the stage's rough surface portions such that frictional force counteracts lateral movement of the carrier relative to the stage, for example, when vertical pressure is applied to the carrier and stage to eutectic bond a COSA to a slider. In some examples, the carrier may be a chip carrier that may hold and stabilize the COSA, or other integrated circuit. In other examples, the carrier may be a slider carrier that may hold and stabilize a slider. Some embodiments may incorporate two sets of stages and carriers—one top set relative to holding, aligning, and stabilizing a COSA carrier coupled to a COSA, and one bottom set relative to holding, aligning, and stabilizing a slider carrier coupled to a slider head. Together, the two stage and carrier sets may be configured, as disclosed herein, to align the COSA with respect to the slider and provide opposing pressure to the COSA and slider, while also providing heat sufficient to enable eutectic bonding of the COSA to the slider.

FIG. 1 is a perspective view diagram of a chip-to-chip bonding device. The bonding device may include a stage 100 and a carrier 110. Stage 100 may be, for example, a bond head heater stage. Stage 100 includes top surface 106 and bottom surface 108. In some embodiments, stage 100 includes vacuum apertures 102 and 104 extending between stage top surface 106 and stage bottom surface 108. Vacuum aperture 104 may be a component vacuum aperture configured to provide vacuum coupling directly or indirectly to a component 120. Component 120 may be, for example, a COSA or slider. Vacuum aperture 102 may be configured to provide vacuum coupling to carrier 110.

In some embodiments, stage 100 may be configured to be mechanically positioned with respect to its lateral or vertical axes. In some embodiments, stage 100 includes a direct heat source to provide heat to the stage, as well as to carrier 110 and component 120. In other embodiments, an indirect heat source may be configured to provide heat to stage 100, carrier 110, and component 120.

Still referring to FIG. 1, carrier 110 includes top surface 112 and bottom surface 114. Vacuum aperture 104 extending through stage 100 may further be configured to extend between carrier top surface 112 and carrier bottom surface 114 such that it provides vacuum coupling to component 120. In some embodiments, carrier 110 vacuum couples to stage 100 when carrier top surface 112 is brought in contact with stage bottom surface 108 and air pressure is removed any of the vacuum apertures 102. Accordingly, carrier 110 is held in a stable position under stage 100 such that any lateral or vertical movement experienced by stage 100 is translated to carrier 110. Also, if component 120 (for example, an integrated circuit or a COSA) is vacuum coupled to carrier 110 as illustrated, any lateral or vertical movement experienced by stage 100 and carrier 110 is also translated to component 120.

In some examples, component 120 may be affixed to carrier 110 using other mechanical coupling technologies such as form fitting, snap-fitting, press-fitting, or other coupling techniques as known in the art. Similarly, carrier 110 may be affixed to stage 100 using other mechanical coupling technologies such as form fitting, snap-fitting, press-fitting, or other coupling techniques as known in the art.

Still referring to FIG. 1, the bonding device may include stage 150 and carrier 160. In some configurations, the bonding device may include a top stage set comprising a top stage 100 and a top carrier 110 configured to hold, position, and align component 120, as well as a bottom stage set comprising bottom stage 150 and bottom carrier 160 configured to hold, position, and align component 170. For example, top stage 100 may be a bond head heater stage and bottom stage 150 may be a bond slider heater stage, wherein component 120 may be an integrated circuit or COSA and component 170 may be a slider. Alternatively, in some embodiments, the entire bonding device may be inverted such that component 120 is a slider and component 170 is an integrated circuit or COSA. Components 120 and 170 may also be other component types wherein component 120 is intended to be bonded to component 170 and wherein aligning component 120 to component 170 is important during the bonding process. In many embodiments, component 120 may be bonded to component 170 using eutectic bonding by providing opposing vertical force or pressure between the components while also providing heat, provided that the opposing surfaces of component 120 and/or component 170 comprise a eutectic alloy.

As further illustrated by FIG. 1, stage 150 includes bottom surface 156 and top surface 158. In some embodiments, stage 150 includes vacuum apertures 152 and 154 extending between stage bottom surface 156 and stage top surface 158. Vacuum aperture 154 may be a component vacuum aperture configured to provide vacuum coupling directly or indirectly to a component 170. Component 170 may be, for example, a slider or COSA. Vacuum aperture 152 may be configured to provide vacuum coupling to carrier 160.

In some embodiments, stage 150 may be configured to be mechanically positioned with respect to its lateral or vertical axes. In alternate embodiments, stage 150 may be fixed on its vertical axis, but may be configured for mechanical positioning along its lateral axes. Still in other embodiments, stage 150 may be fixed both vertically and laterally allowing alignment of components 120 and 170 to be controlled entirely through lateral and vertical positioning of stage 100. Stage 150 may include a direct heat source to provide heat to the stage, as well as to carrier 160 and component 170. As either an alternative to, or a supplement of the direct heat source, the bonding device may include an indirect heat source configured to provide heat to stage 150, carrier 160, and component 170.

Still referring to FIG. 1, carrier 160 includes top surface 162 and bottom surface 164. Vacuum aperture 154 extending through stage 150 may further be configured to extend between carrier top surface 162 and carrier bottom surface 164 such that it provides vacuum coupling to component 170. In some embodiments, carrier 160 vacuum couples to stage 150 when carrier bottom surface 164 is brought in contact with stage top surface 158 and air pressure is removed any of the vacuum apertures 152. Accordingly, carrier 160 is held in a stable position above stage 150 such that any lateral or vertical motion experienced by stage 150 is translated to carrier 160. Also, if component 170 (for example, a slider) is vacuum coupled to carrier 160 as illustrated, any lateral or vertical movement experienced by stage 150 and carrier 160 is also translated to component 170.

In some examples, component 170 may be affixed to carrier 160 using other mechanical coupling technologies such as form fitting, snap-fitting, press-fitting, or other coupling techniques as known in the art. Similarly, carrier 160 may be affixed to stage 150 using other mechanical coupling technologies such as form fitting, snap-fitting, press-fitting, or other coupling techniques as known in the art.

Figure 2A:
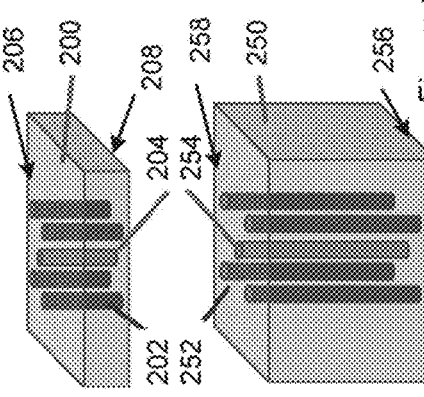
FIG. 2A is a perspective view diagram of stage components from a chip-to-chip bonding device consistent with embodiments disclosed herein.

FIG. 2A is a perspective view diagram of stage components from a chip-to-chip bonding device. As illustrated, bond head stage 200 includes a top surface 202, a bottom surface 208, and a plurality of vacuum apertures 202 and 204 extending therebetween. Also as illustrated, bond slider stage 250 includes a top surface 258, a bottom surface 256, and a plurality of vacuum apertures 252 and 254 extending therebetween.

Figure 2B:
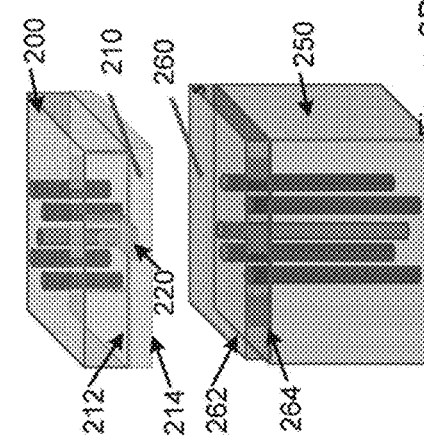
FIG. 2B is a perspective view diagram of the bond head stage mechanically coupling to a component carrier and the bond slider stage mechanically coupling to a bond stage tool consistent with embodiments disclosed herein.

FIG. 2B is a perspective view diagram of the bond head stage mechanically coupling to a component carrier and the bond slider stage mechanically coupling to a bond stage tool. As illustrated, component carrier 210 includes a top surface 212 and a bottom surface 214. Component 220 may mechanically couple to carrier bottom surface 214. Component carrier top surface 212 may mechanically couple to bond head stage 200. For example, the component carrier may vacuum couple to the bond head stage when component carrier top surface 212 contacts vacuum aperture 202 and a vacuum is supplied through vacuum aperture 202, the vacuum being supplied by removing air pressure from the opposite end of the vacuum aperture 202. Alternatively, the component carrier may couple to the bond head stage using other mechanical coupling techniques as known in the art.

Similarly, slider carrier 260 includes a top surface 262 and a bottom surface 264. Slider carrier bottom surface 264 may mechanically couple to bond slider stage 250. For example, the slider carrier may vacuum couple to the bond slider stage when slider carrier bottom surface 264 contacts vacuum aperture 252 and a vacuum is supplied through vacuum aperture 252, the vacuum being supplied by removing air pressure from the opposite end of the vacuum aperture 252. Alternatively, the slider carrier may couple to the bond slider stage using other mechanical coupling techniques as known in the art.

Figure 2C:
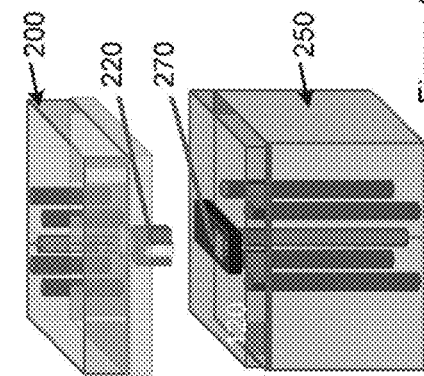
FIG. 2C is a perspective view diagram of the component carrier mechanically coupling to a component and the slider carrier mechanically coupling to a slider consistent with embodiments disclosed herein.

FIG. 2C is a perspective view diagram of the component carrier mechanically coupling to a component and the slider carrier mechanically coupling to a slider. As illustrated, component 220 mechanically couples to component carrier 210, and indirectly to bond head stage 200. For example, component 220 may vacuum couple to carrier 210 using a vacuum created in vacuum aperture 204, as illustrated in FIG. 2A. Vacuum aperture 204 may extend through both bond head stage 200 and component carrier 210 and contact a top surface of component 220 in order to hold component 220 in place when a vacuum is supplied through the vacuum aperture 204.

Similarly, slider 270 mechanically couples to slider carrier 260, and indirectly to bond slider stage 250. For example, slider 270 may vacuum couple to slider carrier 260 using a vacuum created in vacuum aperture 254, as illustrated in FIG. 2A. Vacuum aperture 254 may extend through both bond slider stage 250 and slider carrier 260 and contact a bottom surface of slider 270 in order to hold slider 270 in place when a vacuum is supplied through the vacuum aperture 254.

Figure 2D:
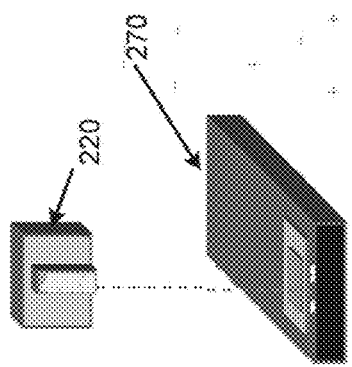
FIG. 2D is a perspective view diagram illustrating a passive alignment process consistent with embodiments disclosed herein.

FIG. 2D is a perspective view diagram illustrating a passive alignment process. As illustrated, component 220 (e.g., a COSA) is aligned with slider 270 during the chip-to-chip bonding process in order to create properly efficient light and electrical couplings between the slider and the COSA. The alignment process may be manual or automated using alignment technologies as known in the art.

Figure 2E:
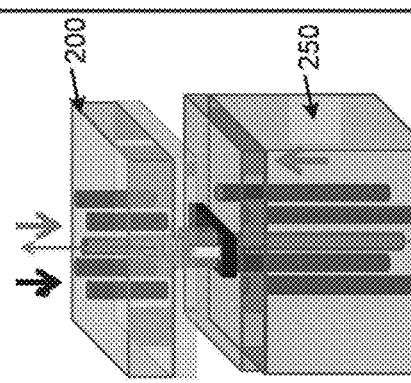
FIG. 2E is a perspective view diagram illustrating a eutectic bonding process consistent with embodiments disclosed herein.
Figure 2F:
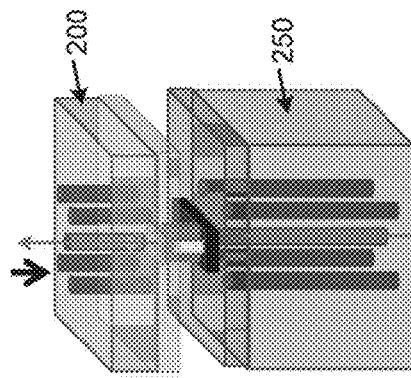
FIG. 2F is a perspective view diagram illustrating a cooling process consistent with embodiments disclosed herein.

FIG. 2E is a perspective view diagram illustrating a chip-to-chip bonding process. As illustrated, with component 220 and slider 270 each mechanically coupled, respectively, through component carrier 210 to bond head stage 200 and through slider carrier 260 to bond slider stage 250, and with component 220 aligned to slider 270, bond head stage 200 is moved downward towards bond slider stage 250, bringing a bottom surface of component 220 in physical contact with a top surface of slider 270, as illustrated by FIG. 2F. In this final position, bonding pressure is supplied by continuing to apply downward force to bond head stage 200, and both bond head stage 200 and bond slider stage 250 are heated using either a direct or indirect heat source. The bond head stage and bond slider stage may continue to supply heat ad pressure to the slider 270 and component 220 until any eutectic alloy present on the surfaces of the slider and component liquefies. The component and slider may then be cooled by removing the heat source until the eutectic alloy re-solidifies, creating a eutectic bond between the slider and component.

FIG. 3A is a cross-section diagram of a carrier with rough and smooth surfaces coupled to a stage with rough surfaces. As illustrated, stage 300 includes a top surface, a bottom surface, and a plurality of vacuum apertures 302 extending therebetween. The top surface includes rough surface portions 305. Carrier 310 includes a bottom surface made up of rough surface portions 315 and smooth surface portions 317. Carrier rough surface portions 315 may be laterally aligned with stage rough surface portions 305, and carrier smooth surface portions 317 may be laterally aligned with vacuum apertures 302 when stage 300 contacts carrier 310. Accordingly, the stage rough surface portions 305 and carrier rough surface portions 315 may frictionally couple together to create sufficient lateral resistance to limit lateral slipping of the carrier with respect to the stage when lateral force is applied. In addition, smooth carrier surface portions 317 may completely cover the openings and extend to the circumferential surface lips of vacuum apertures 302 such that air passage, or leaking from the area between the stage 300 and carrier 310 into vacuum aperture 302 is limited, or eliminated altogether when air pressure is removed from the vacuum apertures 302. Accordingly, the vacuum seal, and corresponding vacuum coupling, between carrier 310 and stage 300 is efficiently strong. Providing frictional coupling between rough surface portions 315 and 305, and vacuum coupling between vacuum apertures 302 and smooth surface portions 317, may create an efficiently strong vacuum coupling between the stage 300 and carrier 310 may be maintained, while limiting lateral slipping between the stage and the carrier when lateral force is applied.

In some embodiments, rough surface portions 305 may have a roughness of between 50 nm and 150 nm when measuring the average vertical distance between the peaks and valleys of the surface topography. Similarly, rough surface portions 315 may also have a roughness of between 50 nm and 150 nm. Smooth surface portions 317 may have a roughness of less than 50 nm. The roughness of rough surface portions 305 and 315 may be varied such that it is less than 50 nm, or more than 150 nm depending on the size and weight of carrier 310 and stage 300, as well as the type of bonding process and degree of bonding force required. Greater roughness will limit lateral slippage when greater bonding pressure is applied, or when larger and/or heavier carriers are utilized. Similarly, the roughness of smooth surface portions 317 may be varied, or increased to 50 nm or more depending on the level of vacuum that is required to maintain an efficient seal between the carrier and the stage. Rough surface portions 305 and 315 may be formed using various surface processing technologies as known in the art, including for example, sand blasting, chemical etching, or ion etching.

FIG. 3B is a cross-section diagram of a carrier with rough and smooth surfaces coupled to a stage with rough surfaces. As illustrated, stage 350 includes a top surface, a bottom surface, and a plurality of vacuum apertures 352 extending therebetween. The top surface includes rough surface portions 355. Carrier 360 includes a bottom surface made up of rough surface portions 365 and a smooth surface portion 367. Carrier rough surface portions 365 may be laterally aligned with stage rough surface portions 355. Accordingly, the stage rough surface portions 355 and carrier rough surface portions 365 may frictionally couple together to create sufficient lateral resistance to limit lateral slipping of the carrier with respect to the stage when lateral force is applied. In addition, smooth carrier surface portion 367 may completely cover each of the openings and extend to the circumferential surface lips of vacuum apertures 352 such that air passage, or leaking from the area between the stage 350 and carrier 360 into vacuum aperture 352 is limited, or eliminated altogether when air pressure is removed from the vacuum apertures 352. Accordingly, the vacuum seal, and corresponding vacuum coupling, between carrier 360 and stage 350 is efficiently strong. Providing frictional coupling between rough surface portions 365 and 355, and vacuum coupling between vacuum apertures 352 and smooth surface portion 367, may create an efficiently strong vacuum coupling between the stage 350 and carrier 360 may be maintained, while limiting lateral slipping between the stage and the carrier when lateral force is applied.

FIG. 4A is side-view diagram illustrating sliding forces present during a chip-to-chip bonding process. As illustrated, vertical bonding force $f_1$ may be applied to component 420. If component a bottom surface of component 420 contacts a top surface of slider 470 wherein the bottom surface of component 420 is not parallel or is irregular with respect to the top surface of slider 470, then lateral sliding force $f_2$ may be created causing slider 470 to move laterally with respect to component 420, as illustrated by FIG. 4B. This lateral movement may create a misalignment between component 420 and slider 470 during the bonding process.

FIG. 5A is side-view diagram illustrating good chip-to-chip alignment during a chip-to-chip bonding process. As illustrated, carrier 510 may vacuum couple to stage 500 when by bringing the carrier in contact with the stage such that a top surface of carrier 510 completely obscures the opening of vacuum aperture 504, and removing or reducing the air pressure from vacuum aperture 504. Similarly, component 520 may vacuum couple to carrier 510 by bringing component 520 in contact with carrier 510 such that it completely obscures the opening of vacuum aperture 502, and removing or reducing the air pressure from vacuum aperture 502. The same vacuum coupling process may be used to couple carrier 560 to stage 550, and slider 570 to carrier 560. Stage 500 may then be positioned to laterally align component 520 with slider 570 prior to lowering stage 500 to bring the component 520 (e.g., a COSA) in contact with slider 570 to administer a eutectic bonding process. The alignment illustrated in FIG. 5A is a desired alignment.

FIG. 5B is side-view diagram illustrating bad chip-to-chip alignment following a chip-to-chip bonding process. As illustrated, the stage 500 may be lowered towards slider 570 to bring component 520 in contact with slider 570, and then continuing to apply downward force, f1, to create a compression of the bottom surface of component 520 and the upper surface of slider 570. As illustrated in FIG. 5B, if the bottom surface of component 520 is not parallel with respect to the top surface of slider 570, then a sliding force f2 may be generated, causing the slider 570 and carrier 560 to slip laterally with respect to their desired positions relative to stages 500 and 550, and component 520, and causing a misalignment of the slider 570 and component 520. This sliding force, f2, may be counteracted by frictional resistance created by frictionally coupling rough surface portions of carrier 560 to the rough surface portions of stage 550, similar to the examples illustrated herein (e.g., FIG. 3A and FIG. 3B).

Figure 6A:
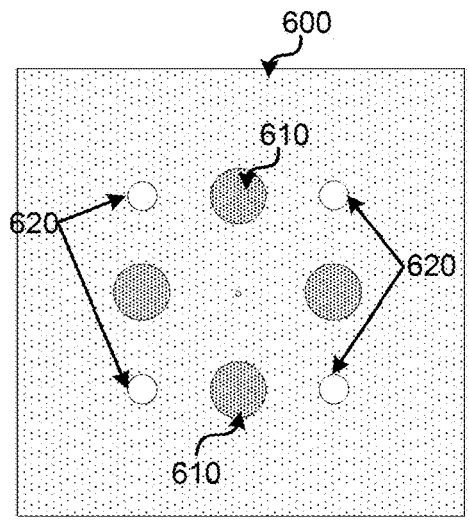
FIG. 6A is a top down view of a carrier surface with disk-shaped rough surface patterns consistent with embodiments disclosed herein.
Figure 6B:
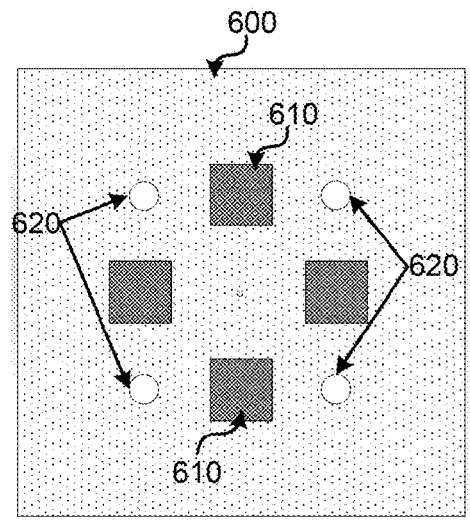
FIG. 6B is a top down view of a carrier surface with square-shaped rough surface patterns consistent with embodiments disclosed herein.
Figure 6C:
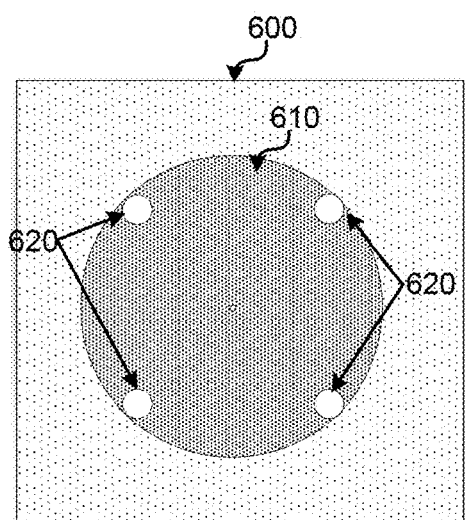
FIG. 6C is a top down view of a carrier surface with a disk-shaped rough surface pattern consistent with embodiments disclosed herein.
Figure 6D:
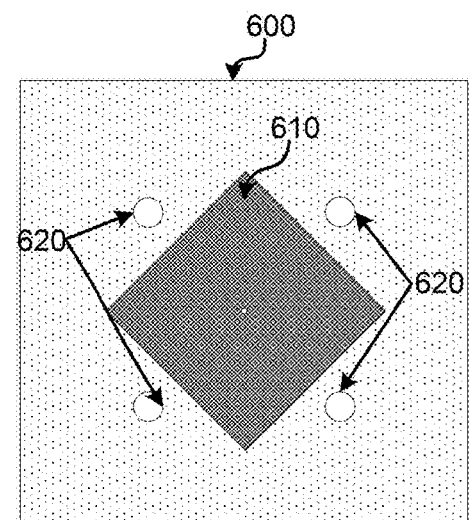
FIG. 6D is a top down view of a carrier surface with a diamond-shaped rough surface pattern consistent with embodiments disclosed herein.

FIG. 6A is a top down view of either a carrier surface with disk-shaped rough surface patterns. FIG. 6B is a top down view of either a carrier surface with square-shaped rough surface patterns. FIG. 6C is a top down view of a carrier surface with a disk-shaped rough surface pattern. FIG. 6D is a top down view of a carrier surface with a diamond-shaped rough surface pattern. Each of the patterns illustrated in FIGS. 6A, 6B, 6C, and 6D combine a series of rough surface portions 610 and smooth surface portions 620 such that the smooth surface portions may entirely obscure the openings to one or more of the stage's vacuum apertures when the stage is brought in contact with the carrier, and the rough surface portions 610 will provide adequate lateral frictional resistance to limit or eliminate lateral slipping during the bonding process. These rough surface portion patterns are exemplary and other patterns and sizes may be used as would be known in the art.

Figure 7:
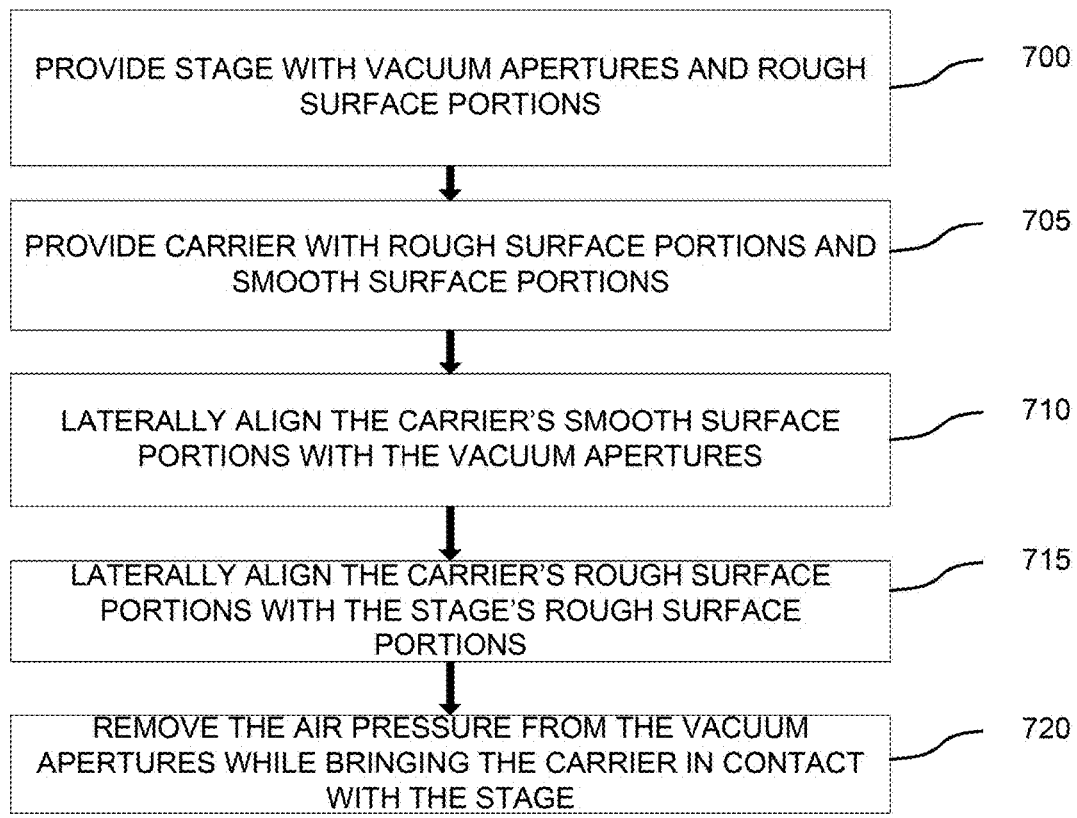
FIG. 7 is a process flow chart illustrating a method for vacuum coupling a carrier to a stage during a chip-to-chip bonding process consistent with embodiments disclosed herein.

FIG. 7 is a process flow chart illustrating a method for vacuum coupling a carrier to a stage during a chip-to-chip bonding process. As illustrated, the method includes providing a stage with vacuum apertures and rough surface portions at step 700 (e.g. the stage disclosed in FIG. 3A and FIG. 3B), providing a carrier with rough surface portions and smooth surface portions at step 705 (e.g. the carrier disclosed in FIG. 3A and FIG. 3B), and laterally aligning the carrier's smooth surface portions with the vacuum apertures such that the opening of one or more of the vacuum apertures is completely obscured by the carrier's smooth surface portions at step 710. The method may also include laterally aligning the carrier's rough surface portions with the stage's rough surface portions at step 715 in order to frictionally couple the carrier to the stage. In some embodiments, the methods also includes removing air pressure from the vacuum apertures while bringing the carrier in contact with the stage at step 720 in order to vacuum couple the carrier to the stage.

Although described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the application, whether or not such embodiments are described and whether or not such features are presented as being a part of a described embodiment. Thus, the breadth and scope of the present application should not be limited by any of the above-described exemplary embodiments.

The terms "over," "under," "between," and "on" as used herein refer to a relative position of one media layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A bonding tool for alignment comprising:
a stage and a carrier;
wherein:
the stage comprises a stage top surface, a stage bottom surface, and a plurality of vacuum apertures extending therebetween, wherein the stage top surface comprises one or more rough stage surface portions having an average roughness of between 50 nm and 150 nm;
the carrier comprises a carrier bottom surface, wherein the carrier bottom surface comprises one or more smooth carrier surface portions having an average roughness of less than 50 nm and one or more rough carrier surface portions having an average roughness of between 50 nm and 150 nm;

at least one smooth carrier surface portion of the one or more smooth carrier surface portions having an average roughness of less than 50 nm laterally aligns to at least one vacuum aperture of the plurality of vacuum apertures when the carrier bottom surface couples to and opposes the stage top surface; and at least one rough carrier surface portion of the one or more rough carrier surface portions having an average roughness of between 50 nm and 150 nm frictionally couples to the at least one rough stage surface portion having an average roughness of between 50 nm and 150 nm such that frictional force counteracts lateral movement of the carrier relative to the stage.

2. The bonding tool of claim 1, wherein the carrier is a chip carrier or a slider carrier.

3. The bonding tool of claim 1, further comprising a heater positioned to project heat on the stage.

4. The bonding tool of claim 1, wherein any rough carrier surface portion having an average roughness of between 50 nm and 150 nm laterally aligns to any rough stage surface portion having an average roughness of between 50 nm and 150 nm when the carrier top surface couples to the stage bottom surface.

5. The bonding tool of claim 4, wherein any smooth carrier surface portion having an average roughness of less than 50 nm forms a disk shape pattern surrounded by any rough carrier surface portion having an average roughness of between 50 nm and 150 nm.

6. The bonding tool of claim 4, wherein any smooth carrier surface portion having an average roughness of less than 50 nm forms a diamond shape pattern surrounded by any rough carrier surface portion having an average roughness of between 50 nm and 150 nm.

* * * * *